(12) United States Patent
Harada et al.

(10) Patent No.: US 11,450,594 B2
(45) Date of Patent: Sep. 20, 2022

(54) SEMICONDUCTOR DEVICE AND POWER CONVERTER

(71) Applicant: Mitsubishi Electric Corporation, Tokyo (JP)

(72) Inventors: Hiroyuki Harada, Tokyo (JP); Akira Kosugi, Tokyo (JP); Takamasa Iwai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 227 days.

(21) Appl. No.: 16/591,116

(22) Filed: Oct. 2, 2019

(65) Prior Publication Data
US 2020/0176366 A1    Jun. 4, 2020

(30) Foreign Application Priority Data
Dec. 3, 2018    (JP) .............................. JP2018-226626

(51) Int. Cl.
*H01L 23/495*    (2006.01)
*H01L 23/31*    (2006.01)
*H02M 7/00*    (2006.01)
*H01L 21/56*    (2006.01)
(Continued)

(52) U.S. Cl.
CPC ........ *H01L 23/49558* (2013.01); *H01L 21/56* (2013.01); *H01L 23/3107* (2013.01); *H02M 7/003* (2013.01); *H02M 7/53871* (2013.01); *H02P 27/08* (2013.01)

(58) Field of Classification Search
None
See application file for complete search history.

(56) References Cited

U.S. PATENT DOCUMENTS

| | | | | |
|---|---|---|---|---|
| 5,031,022 A | * | 7/1991 | Yamamoto | ........ H01L 23/49572 |
| | | | | 257/667 |
| 5,197,183 A | * | 3/1993 | Chia | ................. B29C 45/14655 |
| | | | | 29/827 |

(Continued)

FOREIGN PATENT DOCUMENTS

| | | |
|---|---|---|
| JP | H04215461 A | 8/1992 |
| JP | H05-109963 A | 4/1993 |

(Continued)

OTHER PUBLICATIONS

An Office Action; "Notice of Reasons for Refusal," mailed by the Japanese Patent Office dated Oct. 12, 2021, which corresponds to Japanese Patent Application No. 2018-226626 and is related to U.S. Appl. No. 16/591,116 with English translation.

(Continued)

*Primary Examiner* — Erik T. K. Peterson (74) *Attorney, Agent, or Firm* — Studebaker & Brackett PC (57) ABSTRACT

A semiconductor device includes: semiconductor elements and; a lead frame including a mount having an upper surface over which the semiconductor elements and are mounted; a sealing resin sealing the lead frame and the semiconductor elements and so that outer leads and of the lead frame protrude outwardly; and a resin wall located on an inner lead between the outer lead and the mount of the lead frame. A vertical thickness of the resin wall is greater than a vertical thickness from a lower surface of the sealing resin to a lower end of the lead frame.

5 Claims, 4 Drawing Sheets

(51) Int. Cl.
*H02P 27/08* (2006.01)
*H02M 7/5387* (2007.01)

(56) References Cited

U.S. PATENT DOCUMENTS

| | | | | |
|---|---|---|---|---|
| 5,233,222 A * | 8/1993 | Djennas | H01L 21/565 | 257/676 |
| 5,285,104 A * | 2/1994 | Kondo | H01L 23/4334 | 257/666 |
| 5,332,864 A * | 7/1994 | Liang | H01L 23/49513 | 174/523 |
| 5,368,805 A * | 11/1994 | Motai | B29C 45/14655 | 257/E21.504 |
| 5,661,337 A * | 8/1997 | Manteghi | H01L 23/4334 | 257/676 |
| 5,663,104 A * | 9/1997 | Fukuyama | H01L 21/565 | 257/E21.504 |
| 5,703,399 A * | 12/1997 | Majumdar | H01L 21/565 | 257/675 |
| 5,807,768 A | 9/1998 | Shin | | |
| 5,920,768 A * | 7/1999 | Shintai | H01L 21/565 | 438/112 |
| 5,926,695 A * | 7/1999 | Chu | H01L 23/49503 | 438/111 |
| 5,932,923 A * | 8/1999 | Kim | H01L 21/565 | 257/667 |
| 5,964,030 A * | 10/1999 | Lee | H01L 23/4334 | 29/827 |
| 6,049,120 A * | 4/2000 | Otani | G01L 19/147 | 257/667 |
| 6,818,968 B1 * | 11/2004 | Cheah | H01L 23/3135 | 257/666 |
| 2001/0052639 A1 * | 12/2001 | Jeon | H01L 23/49575 | 257/678 |
| 2003/0155636 A1 * | 8/2003 | Cobbley | H01L 24/32 | 257/675 |
| 2003/0222205 A1 * | 12/2003 | Shoji | H01L 25/167 | 250/214 R |
| 2004/0089928 A1 | 5/2004 | Nakajima et al. | | |
| 2008/0258316 A1 | 10/2008 | Tamba et al. | | |
| 2008/0315379 A1 * | 12/2008 | Kim | H01L 23/16 | 257/675 |
| 2010/0133667 A1 * | 6/2010 | Oka | H01L 25/16 | 257/666 |
| 2012/0038033 A1 * | 2/2012 | Oga | H01L 21/565 | 257/659 |
| 2012/0075816 A1 * | 3/2012 | Mashimo | H01L 23/3121 | 361/760 |
| 2012/0206196 A1 * | 8/2012 | Kato | H01L 23/49551 | 327/564 |
| 2013/0069213 A1 * | 3/2013 | Sohn | H01L 23/4334 | 257/668 |
| 2013/0187627 A1 * | 7/2013 | Imada | H01L 27/088 | 323/311 |
| 2015/0037575 A1 * | 2/2015 | Sakaguchi | C08K 3/38 | 428/354 |
| 2015/0084173 A1 * | 3/2015 | Zhang | H01L 24/49 | 257/676 |
| 2015/0162297 A1 * | 6/2015 | Cho | H01L 23/49575 | 257/76 |
| 2016/0204057 A1 * | 7/2016 | Yato | H01L 23/24 | 257/684 |
| 2017/0103962 A1 * | 4/2017 | Oomae | H01L 23/49572 | |
| 2017/0301613 A1 * | 10/2017 | Lin | H01L 29/1608 | |
| 2018/0061745 A1 * | 3/2018 | Otremba | H01L 23/49555 | |
| 2018/0114735 A1 | 4/2018 | Nakamura et al. | | |
| 2019/0074254 A1 * | 3/2019 | Bai | H01L 23/3142 | |
| 2020/0098701 A1 * | 3/2020 | Harada | H01L 23/562 | |

FOREIGN PATENT DOCUMENTS

| | | |
|---|---|---|
| JP | H09-213844 A | 8/1997 |
| JP | 2004-165281 A | 6/2004 |
| JP | 2008270455 A | 11/2008 |
| JP | 2018067655 A | 4/2018 |
| JP | 2018-133521 A | 8/2018 |

OTHER PUBLICATIONS

An Office Action issued by the German Patent and Trade Mark Office dated May 12, 2022, which corresponds to German Patent Application No. 102019218322.0 and is related to U.S. Appl. No. 16/591,116; with English language translation.

* cited by examiner

SEMICONDUCTOR DEVICE AND POWER CONVERTER

BACKGROUND OF THE INVENTION

Field of the Invention

The present invention relates to technology for improving reliability of a power semiconductor device, such as an IGBT and a diode.

Description of the Background Art

With the progress of consumer appliances, electric railways, and automobiles, an operating temperature of a semiconductor element for use therein has risen. In recent years, a semiconductor element operating at a high temperature has intensively been developed, and the semiconductor element has become smaller, had a higher breakdown voltage, and had a higher current density. In particular, a wide-bandgap semiconductor, such as SiC and GaN, has a wider bandgap than an Si semiconductor, and is expected to make a semiconductor device have a higher breakdown voltage, be smaller, have a higher current density, and operate at a higher temperature. For instrumentation of the semiconductor element having such features, it is required to secure stable operation of the semiconductor device by improving resistance to a temperature change under a harsh usage environment while enhancing insulating reliability of the semiconductor device. For example, Japanese Patent Application Laid-Open No. 2008-270455 discloses technology of precoating a semiconductor device with a polyamide-based resin having excellent heat and moisture resistance before sealing the semiconductor device with an epoxy resin to simultaneously improve thermal fatigue life and moisture resistance of a solder joint of the semiconductor device.

Japanese Patent Application Laid-Open No, 2018-67655 discloses technology of providing a block member facing a circuit board and having a lower coefficient of linear expansion than a sealing resin to suppress warping of a semiconductor device.

Members mounted in a semiconductor device include a member having a low coefficient of linear expansion, such as a semiconductor element. Such a member has not caused any problem when it is sealed by a silicone gel. In a semiconductor device sealed by molding using an epoxy resin and the like, however, separation of the molding resin from the member through a heat cycle of the semiconductor device becomes a problem. To address the problem, there has been a recent tendency to use a molding resin having low coefficient of linear expansion characteristics by highly filling the epoxy resin with ceramic fillers.

While the coefficient of linear expansion of the molding resin is reduced, an elastic modulus and the viscosity of the molding resin are increased by highly filling the resin with the fillers. To make the semiconductor device smaller, the molding resin is required to seal the semiconductor element, a lead frame, and various wires voidlessly. A resin having a high viscosity, however, has a problem in that a void is mixed in a narrow gap region.

In the technology disclosed in Japanese Patent Application Laid-Open No. 2008-270455, for example, the narrow gap region becomes narrower due to application of a stress relieving resin to a narrow gap portion, such as a lower end portion of a wire, and a void remains as a sealing resin does not flow in the region. Furthermore, fluidity of the sealing resin having a high viscosity cannot be controlled, and there is a concern that insulating reliability is reduced due to mixture of a void into an insulating layer in the narrow gap region on a side of a lower surface of a lead frame.

The technology disclosed in Japanese Patent Application Laid-Open No. 2018-67655 is not effective against the reduction in insulating reliability caused due to mixture of the void into the insulating layer in the narrow gap region on the side of the lower surface of the lead frame.

SUMMARY

It is an object of the present invention to provide a semiconductor device having high insulating reliability.

A semiconductor device according to the present invention includes a semiconductor element, a lead frame, a sealing resin, and a resin wall. The lead frame includes a mount having an upper surface over which the semiconductor element is mounted. The sealing resin seals the lead frame and the semiconductor element so that an outer lead of the lead frame protrudes outwardly. The resin wall is located on an inner lead between the outer lead and the mount of the lead frame. A vertical thickness of the resin wall is greater than a vertical thickness from a lower surface of the sealing resin to a lower end of the lead frame.

At the time of filling with the sealing resin, a flow of the sealing resin to a side of an upper surface of the lead frame can be restricted, and thus turning around of the sealing resin from the side of the upper surface to a side of a lower surface of the lead frame can be suppressed. This can suppress formation of a void on the side of the lower surface of the lead frame, and can thus improve insulating reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
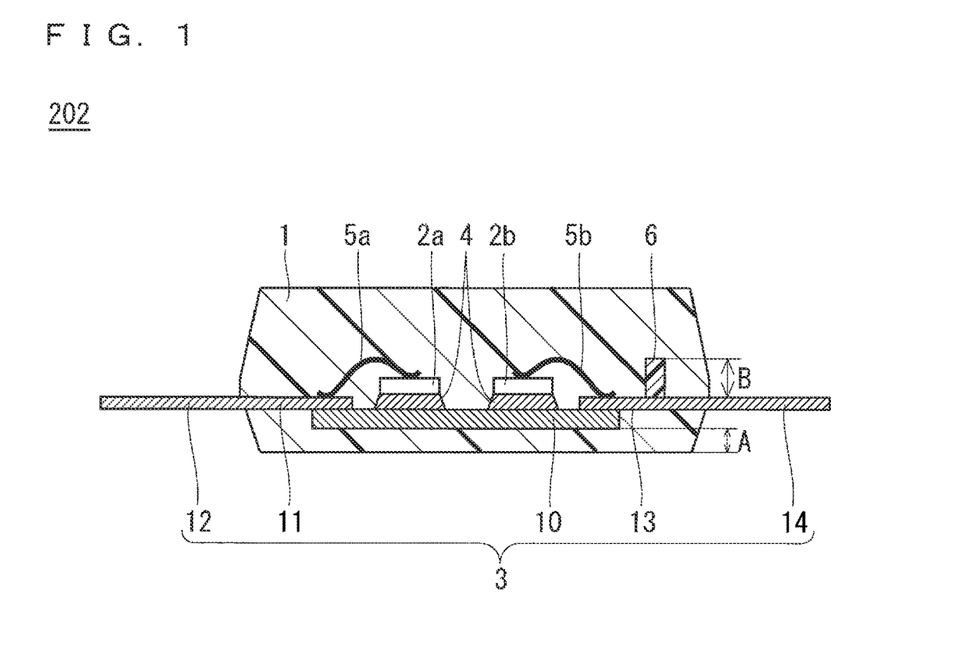
FIG. 1 is a sectional view of an essential part of a semiconductor device according to Embodiment 1.
Figure 2:
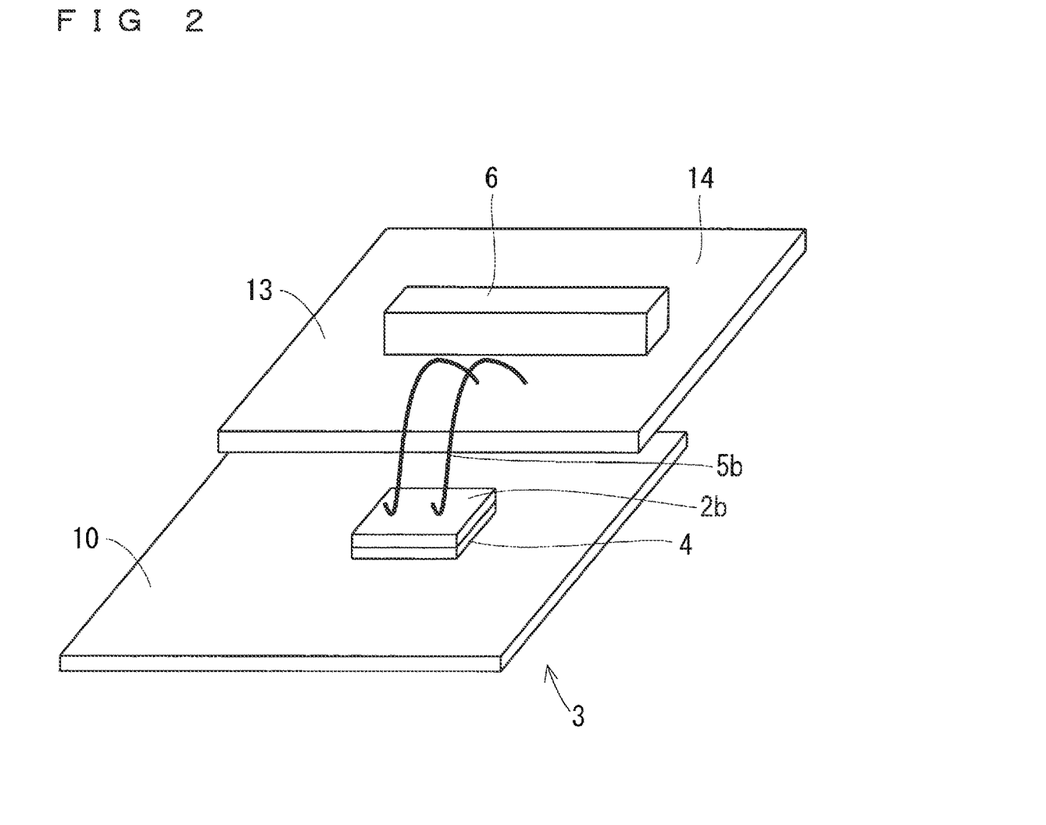
FIG. 2 is a perspective view of a semiconductor element and a resin wall disposed on an upper surface of a lead frame included in the semiconductor device according to Embodiment 1.

Embodiment 1 of the present invention will be described below with use of the drawings. FIG. 1 is a sectional view of an essential part of a semiconductor device 202 according to Embodiment 1. FIG. 2 is a perspective view of a semiconductor element 2b and a resin wall 6 disposed on an upper surface of a lead frame 3 included in the semiconductor device 202.

As illustrated in FIG. 1, the semiconductor device 202 is a semiconductor power module widely used in consumer appliances, industry, automobiles, and trains, for example. The semiconductor device 202 includes a sealing resin 1, semiconductor elements 2a and 2b, the lead frame 3, a bonding material 4, wires 5a and 5b, and the resin wall 6.

The semiconductor elements 2a and 2b are power semiconductor elements operating at 150° C. or more, for example, and are mounted over an upper surface of a mount 10 of the lead frame 3 via the bonding material 4. The semiconductor elements 2a and 2b may each include a so-called wide-bandgap semiconductor made of silicon carbide (SiC), a gallium nitride (GaN)-based material, or a material such as diamond, and having a wider bandgap than silicon (Si). Although only two semiconductor elements 2a and 2b are mounted over the upper surface of the lead frame 3 in FIG. 1, the number of semiconductor elements is not limited to two. The required number of semiconductor elements can be mounted depending on application.

The lead frame 3 includes the mount 10, inner leads 11 and 13, and outer leads 12 and 14. The mount 10 has the upper surface over which the semiconductor elements 2a and 2b are mounted. The inner leads 11 and 13 are respectively connected to left and right end portions of the mount 10. The outer leads 12 and 14 are respectively connected to the inner leads 11 and 13.

The lead frame 3 is typically made of copper, but a material for the lead frame 3 is not limited to copper. The material for the lead frame 3 is not particularly limited as long as it has required heat dissipation characteristics. For example, aluminum or iron may be used, and a composite of them may be used. Alternatively, a composite of copper, invar, and copper, for example, may be used, and an alloy of SiCal or CuMo may be used. The surface of the lead frame 3 is typically plated with nickel, but a configuration of the surface of the lead frame 3 is not limited to this configuration. The surface of the lead frame 3 may be plated with gold or tin, and is only required to have a configuration in which a required current and a required voltage can be supplied to the semiconductor elements 2a and 2b. At least part of the lead frame 3 and an electrode pattern may have fine irregularities on the surface thereof or may have an adhesion promoter provided thereon by undergoing priming and the like to improve adhesion to a resin.

The bonding material 4 may be not only a typical solder material but also a sintered material made of silver, and is not particularly limited as long as it has both required thermal conductivity and bonding properties.

The wire 5a connects the semiconductor element 2a with the inner lead 11. The wire 5b connects the semiconductor element 2b with the inner lead 13. A linear body made of aluminum, silver, or gold and having a circular cross section is used as each of the wires 5a and 5b, but a configuration of each of the wires 5a and 5b is not limited to this configuration. A strip of copper plate having a square cross section may be used, for example.

Although two wires 5a and two wires 5b are connected respectively to the semiconductor element 2a and the semiconductor element 2b in FIG. 1, the number of wires connected to each semiconductor element is not limited to two. The required number of wires can be connected depending on the current density of the semiconductor elements 2a and 2b, and the like. Fusion bonding, ultrasonic bonding, or the like with respect to a piece of metal, such as copper and tin, can be used to bond the wires 5a and 5b, but a method and a configuration to achieve bonding are not particularly limited as long as a required current and a required voltage can be supplied to the semiconductor elements 2a and 2b.

The sealing resin 1 seals the lead frame 3 and the semiconductor elements 2a and 2b so that the outer leads 12 and 14 of the lead frame 3 protrude outwardly. Specifically, the sealing resin 1 seals the mount 10 and the inner leads 11 and 13 of the lead frame 3 and the semiconductor elements 2a and 2b. The sealing resin 1 is an epoxy resin, for example, but is not limited to the epoxy resin. The sealing resin 1 may be any resin having desired elastic modulus and heat resistance.

The resin wall 6 is provided on an upper surface of the inner lead 13 between the outer lead 14 and the mount 10 of the lead frame 3 to be perpendicular to the inner lead 13, and is sealed by the sealing resin 1. A vertical thickness B of the resin wall 6 is greater than a vertical thickness A from a lower surface of the sealing resin 1 to a lower end of the lead frame 3. The lower end of the lead frame 3 is herein a lower end of the mount 10. The resin wall 6 is made of an epoxy resin, a silicone resin, a urethane resin, a polyimide resin, a polyamide resin, a polyamide-imide resin, an acrylic resin, or the like, but a material for the resin wall 6 is not limited to them. The resin wall 6 may be made of any material having both insulation and adhesiveness.

As illustrated in FIGS. 1 and 2, an upper end of the resin wall 6 is at a higher location than an upper end of the wire 5b. The upper end of the wire 5b is herein a portion of the wire 5b at the highest location. The resin wall 6 is provided to be within 10 mm from a joint between the wire 5b and the lead frame 3, and to be closer to the outer lead 14 of the lead frame 3 than the joint is. The resin wall 6 is provided in the vicinity of the joint to be closer to the outer lead 14 as described above, so that deformation of the wires 5a and 5b can effectively be suppressed at the time of filling with the sealing resin 1.

The resin wall 6 is provided only in one direction relative to the wire Sb, but the number of directions in which the resin wall 6 is provided is not limited to one. The resin wall 6 may be provided in two to four directions relative to the wire 5b. It is desirable that at least one direction in which the resin wall 6 is provided be perpendicular to a direction in which the sealing resin 1 flows at the time of filling with the sealing resin The resin wall 6 is formed on the lead frame 3 typically by applying a resin using a dispenser. The resin wall 6 is only required to be formed after the semiconductor elements 2a and 2b are bonded to the lead frame 3 via the bonding material 4, and the wires 5a and 5b are formed, that is, before filling with the sealing resin 1. In a case where the vertical thickness of the resin wall 6 cannot satisfy a desired thickness only through application of the resin using the dispenser as the upper ends of the wires 5a and 5b are at higher locations, the resin wall 6 separately manufactured as a block may be placed on the lead frame 3.

In the semiconductor device 202 in which the lead frame 3 is mounted, a narrow gap region is formed on a side of a lower surface of the mount 10, but the narrow gap region becomes an important region for the semiconductor device 202 to secure insulating properties of the device.

The semiconductor elements 2a and 2b are members typically having a low coefficient of linear expansion. The sealing resin 1, which is a highly elastic resin typified by the epoxy resin, is set to have a low coefficient of linear expansion to suppress separation of the sealing resin 1 from the semiconductor elements 2a and 2b through a heat cycle. However, the viscosity of the sealing resin 1 tends to increase with an increase in elastic modulus as the sealing resin 1 is highly filled with fillers to reduce the coefficient of linear expansion. This reduces fluidity of the sealing resin 1, and thus raises concerns that filling of the narrow gap region becomes difficult, a void is formed on the side of the lower surface of the mount 10, and insulating reliability of the semiconductor device 202 is reduced.

Figure 8:
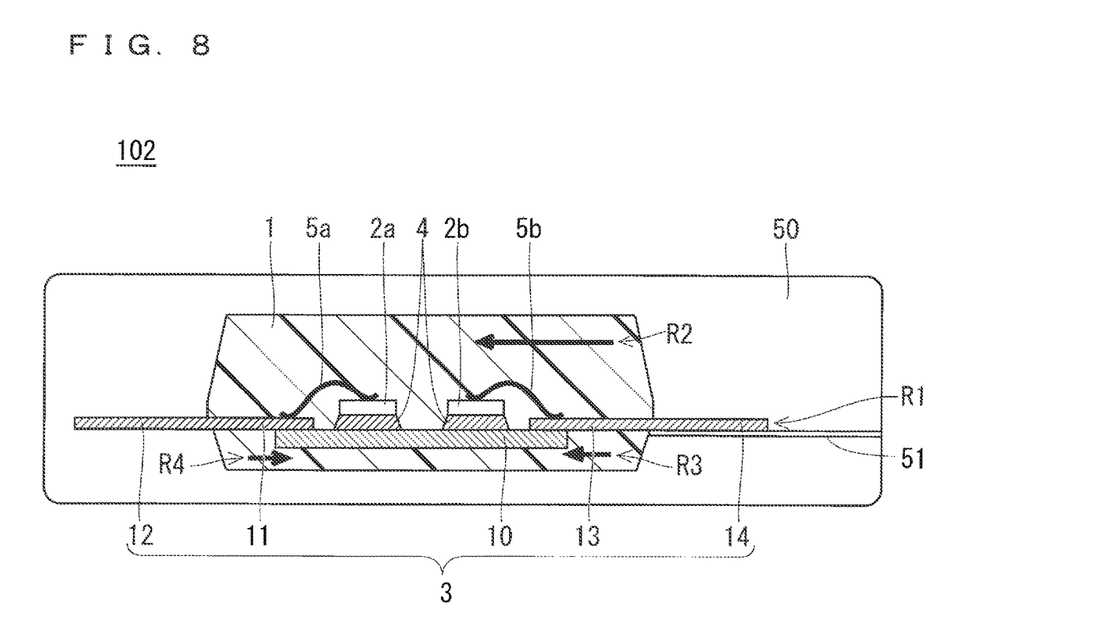
FIG. 8 is a sectional view showing a flow path of a sealing resin in a semiconductor device according to related technology.

The action and the effect of the semiconductor device 202 according to Embodiment 1 will be described next in comparison with related technology. The related technology will be described first. FIG. 8 is a sectional view showing a flow path of the sealing resin 1 in a semiconductor device 102 according to the related technology.

As illustrated in FIG. 8, one typical example of a method of filling with the sealing resin 1 is a method of injecting the sealing resin 1 from a predetermined single point of a mold 50 to fill the mold 50 with the sealing resin 1. In FIG. 8, the sealing resin 1 is injected into the mold 50 from an inlet 51.

In the mold-type semiconductor device 102 in which the lead frame 3 is mounted, the sealing resin 1 is injected from a side surface of the lead frame 3 shown by a reference sign R1. The sealing resin 1 injected from the side surface R1 passes through two broadly classified paths: a path R2 on the side of the upper surface of the lead frame 3; and a path R3 on the side of the lower surface of the lead frame 3, and seals the semiconductor device 102 placed in the mold 50. In this case, the narrow gap region is on the path R3, and thus the sealing resin 1 passing through the path R3 requires more time to complete filling than the sealing resin 1 passing through the path R2 injected at the same time.

As a result, the sealing resin 1 passing through the path R2 turns around after completing filling of an end portion of the mold 50, and starts filling a region on the side of the lower surface of the lead frame 3 through a path R4 against the sealing resin 1 passing through the path R3. Air between the sealing resin 1 passing through the path R3 and the sealing resin 1 passing through the path R4 on the side of the lower surface of the lead frame 3 has no way to escape, a void is formed in the sealing resin 1, and the insulating reliability of the semiconductor device 102 is reduced significantly.

Figure 3:
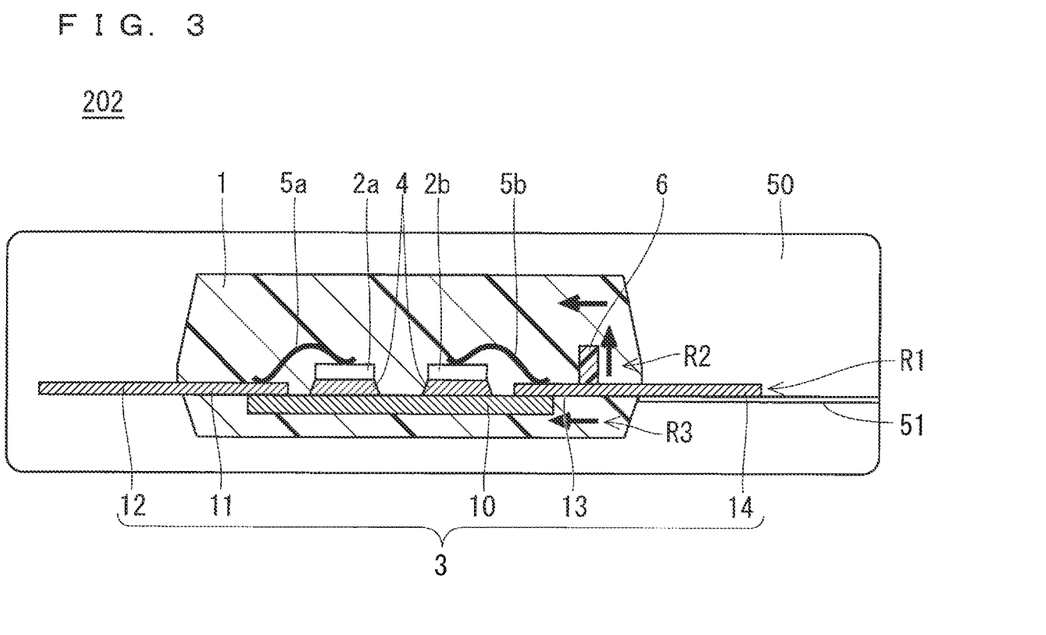
FIG. 3 is a sectional view showing a flow path of a sealing resin in the semiconductor device according to Embodiment 1.

A flow path of the sealing resin 1 in the semiconductor device 202 according to Embodiment 1 will be described next. FIG. 3 is a sectional view showing the flow path of the sealing resin 1 in the semiconductor device 202.

As illustrated in FIG. 3, since the resin wall 6 is formed on the upper surface of the inner lead 13, a flow of the sealing resin 1 injected from the side of the upper surface of the lead frame 3 is restricted by the resin wall 6. By increasing time required for the sealing resin 1 injected through the path R2 to complete filling on the side of the upper surface of the lead frame 3 as described above, filling on the side of the upper surface of the lead frame 3 is completed in similar time to time required for the sealing resin 1 injected through the path R3 to complete filling on the side of the lower surface of the lead frame 3.

As a result, the flow of the sealing resin 1 through the path R4 can be suppressed, and formation of a void on the side of the lower surface of the lead frame 3 can be suppressed. With increasing vertical thickness of the resin wall 6, a distance by which the sealing resin 1 flows increases, and the effect increases.

Furthermore, in the related technology, the sealing resin 1 filling the side of the upper surface of the lead frame 3 through the path R2 tends to deform the wires 5a and 5b by a stress generated at the time of filling. Contact of the wires 5a and 5b with the semiconductor elements 2a and 2b and contact of the wires 5a and 5b with each other made by deformation of the wires 5a and 5b can interfere with electric functions of the semiconductor device 102, and accelerate poor characteristics.

In the semiconductor device 202 according to Embodiment 1, deformation of the wires 5a and 5b caused at the time of filling with the sealing resin 1 can be suppressed by reducing, using the resin wall 6, the stress generated when the sealing resin 1 comes into contact with the wires 5a and 5b.

As described above, in the semiconductor device 202 according to Embodiment 1, the vertical thickness of the resin wall 6 is greater than the vertical thickness from the lower surface of the sealing resin 1 to the lower end of the lead frame 3. At the time of filling with the sealing resin 1, the flow of the sealing resin 1 to the side of the upper surface of the lead frame 3 can be restricted, and thus turning around of the sealing resin 1 from the side of the upper surface to the side of the lower surface of the lead frame 3 can be suppressed. This can suppress formation of a void on the side of the lower surface of the lead frame d improve the insulating reliability of the semiconductor device 202.

Furthermore, deformation of the wires 5a and 5b caused at the time of filling with the sealing resin 1 can be suppressed. For these reasons, durability and yield of the semiconductor device 202 can be improved.

The resin wall 6 is provided to be within 10 mm from the joint between the wire 5b and the lead frame 3, and to be closer to the outer lead 14 of the lead frame 3 than the joint is. The resin wall 6 is provided in the vicinity of the joint to be closer to the outer lead 14 as described above, so that deformation of the wires 5a and 5b can effectively be suppressed at the time of filling with the sealing resin 1.

The semiconductor elements 2a and 2b each include the wide-bandgap semiconductor. While cracking of the sealing resin 1 occurs due to a difference in coefficient of linear expansion between members when the semiconductor device 202 is used in a higher temperature range, cracking of the sealing resin 1 can be suppressed in the semiconductor device 202. The effect of suppressing cracking increases when the semiconductor elements 2a and 2b each including the wide-bandgap semiconductor, such as SiC and GaN, are mounted.

Embodiment 2

Figure 4:
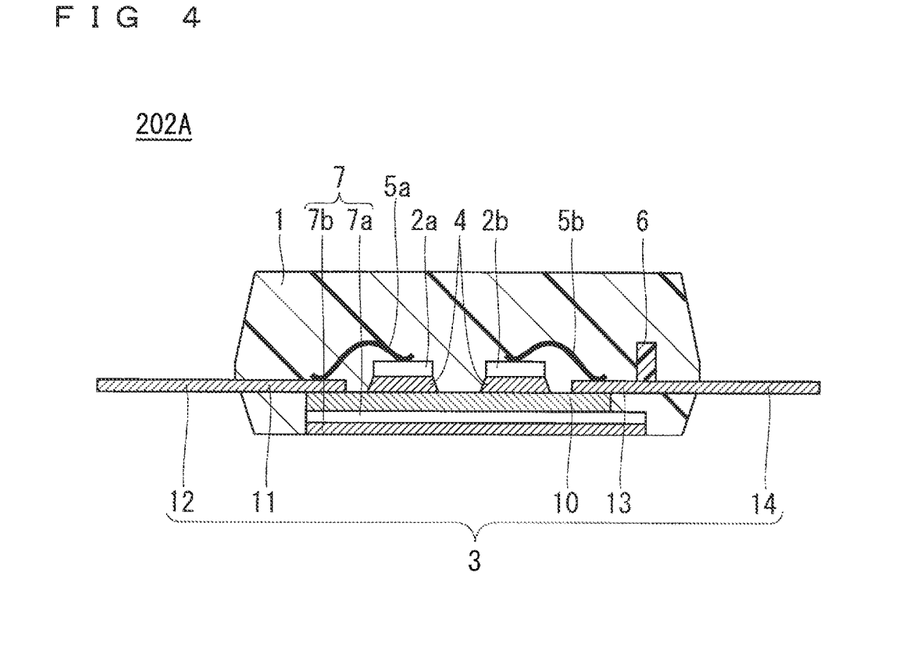
FIG. 4 is a sectional view of an essential part of a semiconductor device according to Embodiment 2.

A semiconductor device according to Embodiment 2 will be described next. FIG. 4 is a sectional view of an essential part of the semiconductor device according to Embodiment 2. In Embodiment 2, the same components as those described in Embodiment 1 bear the same reference signs as those in Embodiment 1, and description thereof is omitted.

As illustrated in FIG. 4, a semiconductor device 202A further includes an insulating sheet 7 disposed at the lower end of the lead frame 3 in Embodiment 2. The insulating sheet 7 is bonded to the lower end of the lead frame 3, that is, to the lower surface of the mount 10 of the lead frame 3, and is provided to secure high insulation and heat dissipation of the mount 10 of the lead frame 3. The insulating sheet 7 includes a sheet layer 7a having insulation and a metal plate 7b. The sheet layer 7a is made of a cured resin in which ceramic powder is dispersed or a cured resin in which a ceramic plate is buried. The sheet layer 7a is bonded to an upper surface of the metal plate 7b, and the thickness of each member can be set freely. Metal foil may be used in place of the metal plate 7b.

The sheet layer 7a is typically made of an epoxy resin, but a material for the sheet layer 7a is not limited to the epoxy resin. The sheet layer 7a may be made of a polyimide resin, a silicone resin, an acrylic resin, or the like, and may be made of any material having both insulation and adhesiveness.

The ceramic powder dispersed in the sheet layer 7a is made of $Al_2O_3$, $SiO_2$, AlN, BN, $Si_3N_4$, or the like, and is spherical in many cases, but a material for and the shape of the ceramic powder are not limited to them. The ceramic powder may have a comminuted, particulate, flaky, or aggregated shape. The sheet layer 7a is only required to be filled with the ceramic powder in an amount allowing for required insulation and heat dissipation.

As the metal plate 7b or the metal foil, copper foil or aluminum foil is typically used, but any member made of metal having heat dissipation may be used.

As described above, the semiconductor device 202A according to Embodiment 2 further includes the insulating sheet 7 disposed at the lower end of the lead frame 3. The mount 10 of the lead frame 3 and the insulating sheet 7 are thus in surface contact with each other, and there is no region to be filled with the sealing resin 1 at the lower end of the lead frame 3. This can suppress formation of a void on the side of the lower surface of the lead frame 3, and improve the insulating reliability of the semiconductor device 202A.

Furthermore, deformation of the wires 5a and 5b caused at the time of filling with the sealing resin 1 can be suppressed by the resin wall 6.

In a case where the insulating sheet 7 is not disposed in a whole area at the lower end of the lead frame 3, that is, the insulating sheet 7 is disposed only in a part of the area at the lower end of the lead frame 3, or in a case where the insulating sheet 7 is not in contact with the lower end of the lead frame 3, the region to be filled with the sealing resin 1 on the side of the lower surface of the lead frame 3 is reduced by disposing the insulating sheet 7. Thus, the flow of the sealing resin 1 to the side of the lower surface of the lead frame 3 is completed earlier than the flow of the sealing resin 1 to the side of the upper surface of the lead frame 3, and formation of a void due to inclusion into the sealing resin 1 on the side of the lower surface of the lead frame 3 can be suppressed.

Embodiment 3

Figure 5:
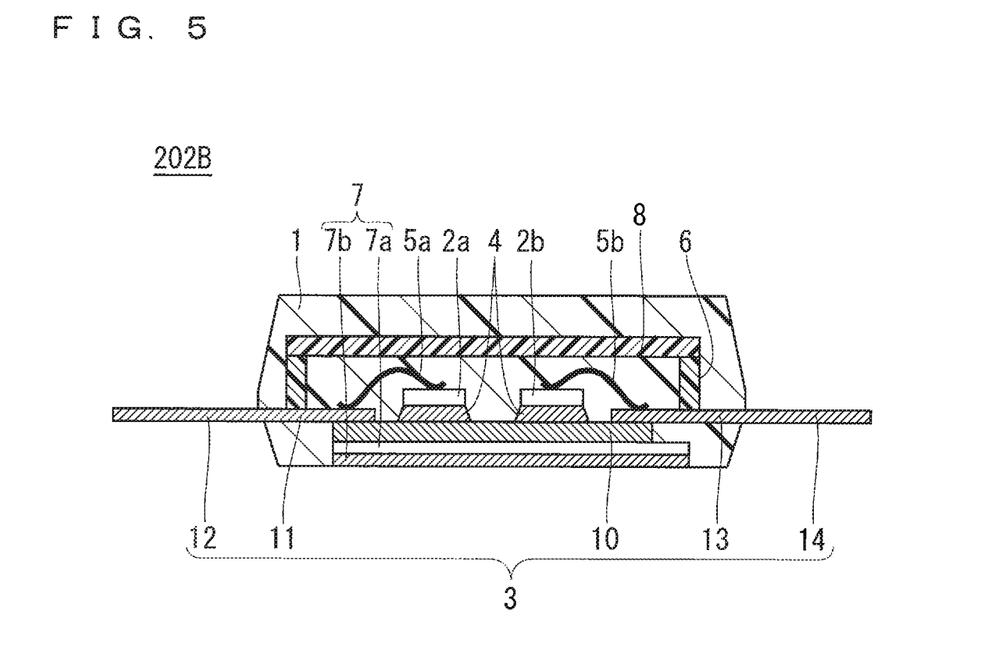
FIG. 5 is a sectional view of an essential part of a semiconductor device according to Embodiment 3.

A semiconductor device according to Embodiment 3 will be described next. FIG. 5 is a sectional view of an essential part of a semiconductor device 202B according to Embodiment 3. In Embodiment 3, the same components as those described in Embodiments 1 and 2 bear the same reference signs as those in Embodiments 1 and 2, and description thereof is omitted.

As illustrated in FIG. 5, in Embodiment 3, the semiconductor device 202B includes two resin walls 6. One of the resin walls 6 is provided on the inner lead 13 between the outer lead 14 and the mount 10 of the lead frame 3 on one side. The other one of the resin walls 6 is provided on the inner lead 11 between the outer lead 12 and the mount 10 of the lead frame 3 on the other side. The semiconductor device 202B further includes a resin plate 8 connecting upper end portions of the two resin walls 6 with each other. The two resin walls 6 and the resin plate 8 are sealed by the sealing resin 1.

In the related technology illustrated in FIG. 8, there is a problem in that separation from various members occurs due to the stress generated by the difference in coefficient of linear expansion of the semiconductor elements 2a and 2b and the lead frame 3 included in the semiconductor device 102 from the sealing resin 1 and, further, by thermal history to thereby reduce reliability. In addition to separation from the various members occurring due to a heat cycle test by the thermal history, there is also a problem in that, in a case where the coefficient of linear expansion is not harmonized with those of the various members, warping of the semiconductor device 102 as a whole occurs to thereby reduce long-term reliability.

To solve these problems, the semiconductor device 202B according to Embodiment 3 includes the two resin walls 6, and one of the resin walls 6 is provided on the inner lead 13 between the outer lead 14 and the mount 10 of the lead frame 3 on one side, and the other one of the resin walls 6 is provided on the inner lead 11 between the outer lead 12 and the mount 10 of the lead frame 3 on the other side. The semiconductor device 202B further includes the resin plate 8 connecting the upper end portions of the two resin walls 6 with each other.

The resin plate 8 can thus relieve the stress generated by the difference in coefficient of linear expansion of the semiconductor elements 2a and 2b, the lead frame 3, and the insulating sheet 7 from the sealing resin 1, and suppress the warping of the semiconductor device 202B as a whole. This can improve the long-term reliability of the semiconductor device 202B.

The resin plate 8 may not necessarily be made of the same material as the resin wall 6. A material for the resin plate 8 can be changed in accordance with the amount of warping required for an end product of the semiconductor device 202B. In a case where the material is changed, the semiconductor device 202B can easily be manufactured by placing the resin plate 8 cured in advance on the resin wall 6 before being cured, but may be manufactured in any method.

By selecting a material having a higher coefficient of linear expansion than the sealing resin 1 as a material for the resin plate 8, the coefficient of linear expansion becomes closer to the coefficient of linear expansion of the lead frame 3 and the insulating sheet 7 as the included members, and the effect of reducing the amount of warping of the semiconductor device 202B as a whole increases. The shape and the thickness of the resin plate 8 are herein not particularly limited, but the effect increases with increasing thickness, size, and volume of the resin plate 8.

As in the other embodiments, a semiconductor device having high insulating reliability can be obtained by suppressing formation of a void on the side of the lower surface of the lead frame 3 and by suppressing deformation of the wires 5a and 5b in Embodiment 3.

Embodiment 4

Figure 6:
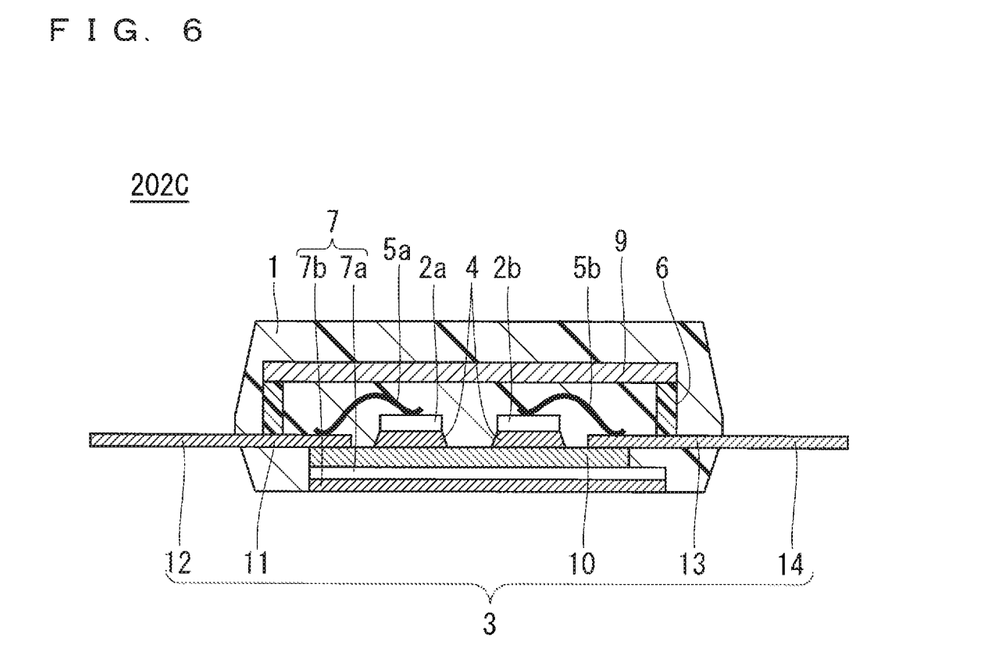
FIG. 6 is a sectional view of an essential part of a semiconductor device according to Embodiment 4.

A semiconductor device according to Embodiment 4 will be described next. FIG. 6 is a sectional view of an essential part of a semiconductor device 202C according to Embodiment 4. In Embodiment 4, the same components as those described in Embodiments 1 to 3 bear the same reference signs as those in Embodiments 1 to 3, and description thereof is omitted.

As illustrated in FIG. 6, the semiconductor device 202C according to Embodiment 4 includes a ceramic plate 9 in place of the resin plate 8 of the semiconductor device 202B according to Embodiment 3.

A ceramic material for the ceramic plate 9 is $Al_2O_3$, $SiO_2$, AlN, BN, $Si_3N_4$, and the like, but is not particularly limited. The ceramic material may be any material having required insulating characteristics.

As described above, the semiconductor device 202C according to Embodiment 4 includes the two resin walls 6, and one of the resin walls 6 is provided on the inner lead 13 between the outer lead 14 and the mount 10 of the lead frame 3 on one side, and the other one of the resin walls 6 is provided on the inner lead 11 between the outer lead 12 and the mount 10 of the lead frame 3 on the other side. The semiconductor device 202C further includes the ceramic plate 9 connecting the upper end portions of the two resin walls 6 with each other.

The ceramic material for the ceramic plate 9 absorbs a smaller amount of moisture than resin, and can suppress expansion caused by moisture absorption. The ceramic material can thus suppress moisture absorption into the semiconductor elements 2a and 2b mounted in the semiconductor device 202B, and improve reliability of the semiconductor device 202C with respect to moisture absorption.

As in the other embodiments, the semiconductor device 202C having high insulating reliability can be obtained by suppressing formation of a void on the side of the lower surface of the lead frame 3 and by suppressing deformation of the wires 5a and 5b in Embodiment 4.

Embodiment 5

In the present embodiment, the above-mentioned semiconductor device 202 according to Embodiment 1 is applied to a power converter. The present invention is not limited to a specific power converter, and a case where the present invention is applied to a three-phase inverter will be described below as Embodiment 5.

Figure 7:
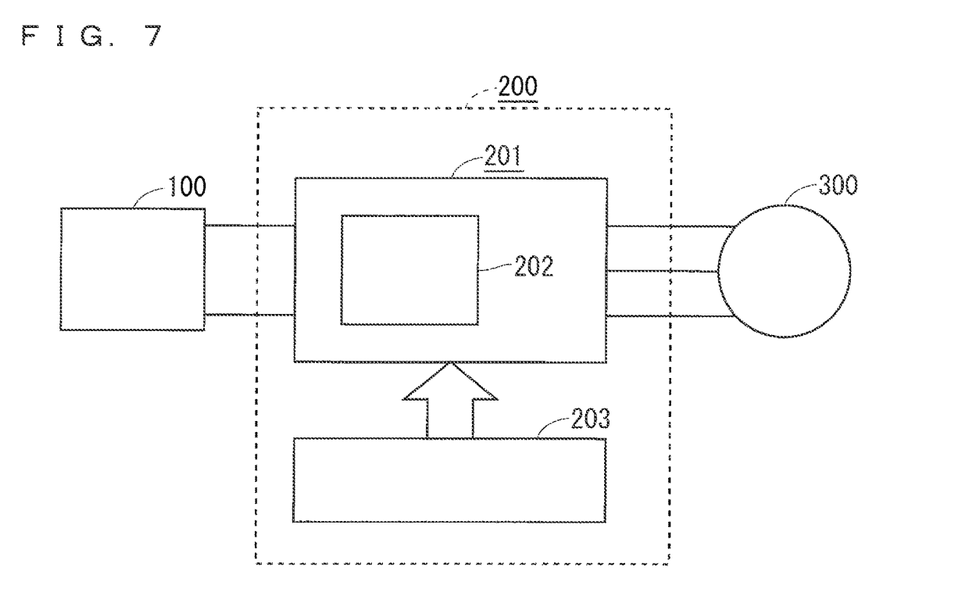
FIG. 7 is a block diagram showing a configuration of a power conversion system to which a power converter according to Embodiment 5 is applied.

FIG. 7 is a block diagram showing a configuration of a power conversion system to which the power converter according to Embodiment 5 is applied.

The power conversion system shown in FIG. 7 includes a power supply 100, a power converter 200, and a load 300. The power supply 100 is a DC power supply, and supplies DC power to the power converter 200. The power supply 100 can be configured by various members. For example, the power supply 100 can be configured by a DC system, a solar cell, and a storage battery, or may be configured by a rectifying circuit or an AC/DC converter connected to an AC system. The power supply 100 may be configured by a DC/DC converter that converts DC power output from the DC system into predetermined power.

The power converter 200 is a three-phase inverter connected between the power supply 100 and the load 300, and converts the DC power supplied from the power supply 100 into AC power, and supplies the AC power to the load 300. As shown in FIG. 7, the power converter 200 includes a main conversion circuit 201 converting the DC power into the AC power and outputting the AC power, and a control circuit 203 outputting a control signal for controlling the main conversion circuit 201 to the main conversion circuit 201.

The load 300 is a three-phase motor driven by the AC power supplied from the power converter 200. The load 300 is not limited to a load for a specific application, and is a motor mounted in various electric apparatuses. For example, the load 300 is used as a motor for hybrid vehicles, electric vehicles, railway vehicles, elevators, and air conditioners.

The power converter 200 will be described in details below. The main conversion circuit 201 includes a switching element and a freewheeling diode (not shown), and converts, through switching performed by the switching element, the DC power supplied from the power supply 100 into the AC power, and supplies the AC power to the load 300. The main conversion circuit 201 may have various specific circuit configurations, but the main conversion circuit 201 according to the present embodiment is a two-level three-phase full bridge circuit, and can include six switching elements and six freewheeling diodes connected in anti-parallel with the respective switching elements. Each of the switching elements and the freewheeling diodes of the main conversion circuit 201 is configured by a semiconductor device corresponding to any of the above-mentioned semiconductor devices according to Embodiments 1 to 3. A case where it is configured by the semiconductor device 202 according to Embodiment 1 will be described herein. Each two switching elements of the six switching elements are connected in series with each other, and constitute an upper arm and a lower arm. The upper arms and the lower arms constitute respective phases (a U phase, a V phase, and a W phase) of the full bridge circuit. Output terminals of the respective upper and lower arms, that is, three output terminals of the main conversion circuit 201 are connected to the load 300.

The main conversion circuit 201 includes a drive circuit (not shown) driving each switching element. The drive circuit may be incorporated in the semiconductor device 202, or may be provided separately from the semiconductor device 202. The drive circuit generates a drive signal for driving each switching element of the main conversion circuit 201, and supplies the drive signal to a control electrode of each switching element of the main conversion circuit 201. Specifically, the drive circuit outputs a drive signal for switching on each switching element and a drive signal for switching off each switching element to the control electrode of each switching element in accordance with the control signal from the control circuit 203, which will be described below. In a case where the switching element is maintained in an on state, the drive signal is a voltage signal (an on signal) equal to or higher than a threshold voltage of the switching element. In a case where the switching element is maintained in an off state, the drive signal is a voltage signal (an off signal) equal to or lower than the threshold voltage of the switching element.

The control circuit 203 controls each switching element of the main conversion circuit 201 so that desired power is supplied to the load 300. Specifically, the control circuit 203 calculates time (on time) during which each switching element of the main conversion circuit 201 has to be in the on state based on power to be supplied to the load 300. For example, the control circuit 203 can control the main conversion circuit 201 through PWM control to modulate the on time of each switching element based on a voltage to be output. The control circuit 203 outputs a control command (the control signal) to the drive circuit included in the main conversion circuit 201 so that the on signal is output to a switching element that has to be in the on state and the off signal is output to a switching element that has to be in the off state at each time point. The drive circuit outputs the on signal or the off signal as the drive signal to the control electrode of each switching element in accordance with the control signal.

In the power converter according to the present embodiment, the semiconductor device 202 according to Embodiment 1 is applied as each of the switching elements and the freewheeling diodes of the main conversion circuit 201, and thus reliability can be improved.

In the present embodiment, an example in which the present invention is applied to the two-level three-phase inverter is described, but application of the present invention is not limited to that in this example. The present invention can be applied to various power converters. The power converter is the two-level power converter in the present embodiment, but may be a three-level or multi-level power converter, and the present invention may be applied to a single-phase inverter in a case where power is supplied to a single-phase load. In a case where power is supplied to a DC load and the like, the present invention can be applied to the DC/DC converter or the AC/DC converter.

The power converter to which the present invention is applied is not limited to a power converter in a case where the above-mentioned load is a motor. For example, the power converter can be used as a power supply apparatus in an electric discharge machine, a laser processing machine, an induction cooker, and a noncontact power supply system, and can further be used as a power conditioner for a photovoltaic system, a storage system, and the like.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element;
   a lead frame including a mount having an upper surface over which the semiconductor element is mounted;
   a sealing resin sealing the lead frame and the semiconductor element so that an outer lead of the lead frame protrudes outwardly; and
   a resin wall formed of resin and located on an inner lead between the outer lead and the mount of the lead frame, the resin wall being located only on one inner lead of the lead frame, wherein
   a vertical thickness of the resin wall is greater than a vertical thickness from a lower surface of the sealing resin to a lower end of the lead frame.

2. The semiconductor device according to claim 1, wherein
   the resin wall is located to be within 10 mm from a joint between a wire connecting the semiconductor element with the inner lead of the lead frame and the lead frame, and to be closer to the outer lead of the lead frame than the joint is, and
   an upper end of the resin wall is at a higher location than an upper end of the wire.

3. The semiconductor device according to claim 1, further comprising
   an insulating sheet located at the lower end of the lead frame.

4. The semiconductor device according to claim 1, wherein
   the semiconductor element includes a wide-bandgap semiconductor.

5. A power converter comprising:
   a main conversion circuit including the semiconductor device according to claim 1, and converting input power and outputting the converted power; and
   a control circuit outputting a control signal for controlling the main conversion circuit to the main conversion circuit.

* * * * *